(12) United States Patent
Pickerd (10) Patent No.: US 8,928,514 B1
(45) Date of Patent: Jan. 6, 2015

(54) HARMONIC TIME DOMAIN INTERLEAVE TO EXTEND OSCILLOSCOPE BANDWIDTH AND SAMPLE RATE

(71) Applicant: Tektronix, Inc., Beaverton, OR (US)

(72) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/186,406

(22) Filed: Feb. 21, 2014

Related U.S. Application Data (60) Provisional application No. 61/877,798, filed on Sep. 13, 2013.

(51) Int. Cl.
*H03M 1/12* (2006.01)
*G04F 10/00* (2006.01)

(52) U.S. Cl.
CPC .................................. *G04F 10/005* (2013.01)
USPC ......................................... 341/155; 341/141

(58) Field of Classification Search
CPC ..... H03M 1/12; H03M 1/1205; H03M 1/121; H03M 1/1215; H03M 1/1009
USPC ................................................. 341/155, 141
See application file for complete search history.

(56) References Cited

U.S. PATENT DOCUMENTS

| 5,255,267 | A | 10/1993 | Hansen et al. |
|---|---|---|---|
| 5,392,044 | A | 2/1995 | Kotzin et al. |
| 5,568,142 | A | 10/1996 | Velazquez et al. |
| 5,659,546 | A | 8/1997 | Elder |
| 5,668,836 | A | 9/1997 | Smith et al. |
| 5,949,236 | A | 9/1999 | Franchville |
| 6,177,893 | B1 * | 1/2001 | Velazquez et al. ............ 341/118 |
| 6,380,879 | B2 | 4/2002 | Kober et al. |
| 6,473,013 | B1 * | 10/2002 | Velazquez et al. ............ 341/120 |
| 6,771,198 | B2 | 8/2004 | Azadet |
| 6,950,048 | B1 | 9/2005 | Slavin |
| 6,980,147 | B2 | 12/2005 | Mathis et al. |
| 7,058,548 | B2 | 6/2006 | Pupalaikis et al. |
| 7,139,684 | B2 | 11/2006 | Pupalaikis et al. |

(Continued)

FOREIGN PATENT DOCUMENTS

WO 2004038432 A2 5/2004

OTHER PUBLICATIONS

Extended European Search Report for related EP Application No. 12 169 732.0, mailed Jun. 5, 2013, European Patent Office, Netherlands, 13 pages.

(Continued)

*Primary Examiner* — Khai M Nguyen
(74) *Attorney, Agent, or Firm* — Thomas F. Lenihan; Marger Johnson & McCollom PC (57) ABSTRACT

A harmonic time interleave (HTI) system can include a sample clock to provide a reference signal, a summing component to receive the reference signal and a second input, a splitter component to receive an input signal, and delay blocks to each receive an output from the splitter. The HTI system can also include digitizing components to receive the reference signal from the sample clock and an output from each of the mixing components, and a poly-phase filter matrix block to receive an output from each of the digitizing components. The HTI system can also include an interleave reconstruction block to receive an output from the poly-phase filter matrix block and interleave time domain signal samples from each digitizer to create a reconstructed waveform.

18 Claims, 8 Drawing Sheets

(56) References Cited

U.S. PATENT DOCUMENTS

| | | | |
|---|---|---|---|
| 7,219,037 B2 | 5/2007 | Pupalaikis et al. | |
| 7,222,055 B2 | 5/2007 | Pupalaikis et al. | |
| 7,373,281 B2 | 5/2008 | Pupalaikis et al. | |
| 7,474,972 B2 * | 1/2009 | Pickerd et al. | 702/75 |
| 7,519,513 B2 | 4/2009 | Pupalaikis et al. | |
| 7,653,514 B2 | 1/2010 | Pupalaikis et al. | |
| 7,701,842 B2 | 4/2010 | Roberts et al. | |
| 7,711,510 B2 | 5/2010 | Pupalaikis | |
| 8,073,656 B2 | 12/2011 | Pupalaikis et al. | |
| 8,818,209 B1 * | 8/2014 | Snelgrove et al. | 398/202 |
| 2001/0022811 A1 | 9/2001 | Lillington | |
| 2005/0239432 A1 | 10/2005 | Wilcox | |
| 2008/0231488 A1 | 9/2008 | Pickerd et al. | |
| 2009/0002213 A1 | 1/2009 | LaMarche et al. | |
| 2009/0093986 A1 | 4/2009 | LaMarche et al. | |

OTHER PUBLICATIONS

Aziz, Pervez, et al., "Multi Band Sigma Delta Analog to Digital Conversion," 1994 IEEE International Conference on Acoustics, Speech and Signal Processing, vol. III, pp. 249-252, Apr. 19-22, 1994, Adelaide, South Australia.

Gangyaokuang, C., et al., "A Way of Multi-channel A/D for UWB Signal," 1995, Proceedings of the IEEE 1995 National Aerospace and Electronics Conference (NAECON 1995), vol. 1, pp. 206-209, Dayton, Ohio.

Lowenborg, P., et al, "A Design Procedure for 2-Channel Mixed Analog and Digital Filter Banks for A/D Conversion Using Minimax Optimization," Proceedings of ICECS '99, The 6th IEEE International Conference on Electronics, Circuits and Systems, vol. 3, pp. 1189-1192, Sep. 5-8, 1999, Pafos, Cyprus.

Namgoong, W., "A Channelized DSSS Ultra-Wideband Receiver," Radio and Wireless Conference, 2001, IEEE, pp. 105-108, Aug. 19-22, 2001, Waltham, Massachusetts.

Petraglia, A, et al., "Effects of Quantization Noise in Parallel Arrays of Analog-to-Digital Converters," 1994 IEEE International Symposium on Circuits and Systems, vol. 5, pp. 337-340, May 30-Jun. 2, 1994, London, England.

Kong, S. K., et al., Frequency Domain Analysis of $\Pi\Delta\Sigma$ ADC and Its Application to Combining Subband Decomposition and $\Pi\Delta\Sigma$ ADC, IEEE 39th Midwest Symposium on Circuits and Systems, vol. 1, pp. 226-229, Aug. 18-21, 1996, Ames, Iowa.

Velazquez, S., "High-Performance Advanced Filter Bank Analog-to-Digital Converter for Universal RF Receivers," Proceedings of the IEEE-SP International Symposium on Time-Frequency and Time-Scale Analysis, pp. 229-232, Oct. 6-9, 1998, Pittsburgh, Pennsylvania.

Velazquez, S., et al. "A Hybrid Filter Bank Approach to Analog-to-Digital Conversion," Proceedings of the IEEE-SP International Symposium on Time-Frequency and Time-Scale Analysis, pp. 116-119, Oct. 25-28, 1994, Philadelphia, Pennsylvania.

\* cited by examiner

HARMONIC TIME DOMAIN INTERLEAVE TO EXTEND OSCILLOSCOPE BANDWIDTH AND SAMPLE RATE

TECHNICAL FIELD

The disclosed technology pertains generally to oscilloscopes and, more particularly, to a harmonic time interleave (HTI) system for extending the bandwidth and sample rate of an oscilloscope.

BACKGROUND

Over the past ten years, certain companies have used mixer topology to multiply bandwidth and some now lead the market place in both bandwidth and sample rate using this technology. Band overlay mixer technology has also been used. Some companies have explored digital bandwidth interleave (DBI), which uses one mixer per channel with one band to build the signal using software mixers for reconstruction. At least one company has developed a two-channel 60 GHz oscilloscope that uses mixers to increase the bandwidth, though the topology used for this is currently unknown.

At least one company has taken a sequential multi-acquisition approach using one channel to multiply bandwidth over multiple acquisitions. Also explored has been the notion of a harmonic mixer of any general mixer harmonic configuration, which includes the 1.0 factor in the reference oscillator summation of signals. There has also been an asynchronous time interleave (ATI) application that is also a harmonic mixer approach with multiple overlaid bands on each channel. Numerous other configurations of mixer topology layouts have been considered over the past ten years.

SUMMARY

Embodiments of the disclosed technology are generally directed to techniques for extending bandwidth and sample rate in an oscilloscope acquisition system. Such techniques generally include the use of analog mixers in the path to standard interleaved digitizer blocks. Such techniques enable signal reconstruction to be performed using simple time domain interleave of the output of all digitizers, thus requiring less digital signal processing (DSP) to perform the reconstruction than would be needed by other techniques (e.g., digital bandwidth interleave (DBI) or asynchronous time interleave (ATI)). Embodiments of the disclosed technology provide many advantages, including greater efficiency with regard to use of the existing bandwidth and sample rate capabilities of the digitizers in the system. Embodiments may also provide an optimized delay capability, e.g., to optimize the phase of the mixer LO harmonics in order to maximize signal-to-noise ratio (SNR).

DETAILED DESCRIPTION

The disclosed technology is generally directed to harmonic time interleave (HTI), which is a new oscilloscope acquisition system topology that uses harmonic mixers on the front end to increase bandwidth and the sample rate to be higher than the individual digitizers in the system can support. Among the numerous advantages provided by HTI over other techniques (e.g., ATI and DBI) is that it requires no software mixing functions to reconstruct the signal; rather, it simply requires performing an M-way time domain interleave of the output of the M digitizers. This can be achieved by applying the same reference oscillator input with harmonics to all mixers, and by providing different delays to the input radio frequency (RF) signal to each mixer. The mixer reference harmonics are generated from an oscillator and multiplier circuits and can be designed for optimized phase relationships to maximize signal-to-noise (SNR) into the mixer LO input.

Figure 1:
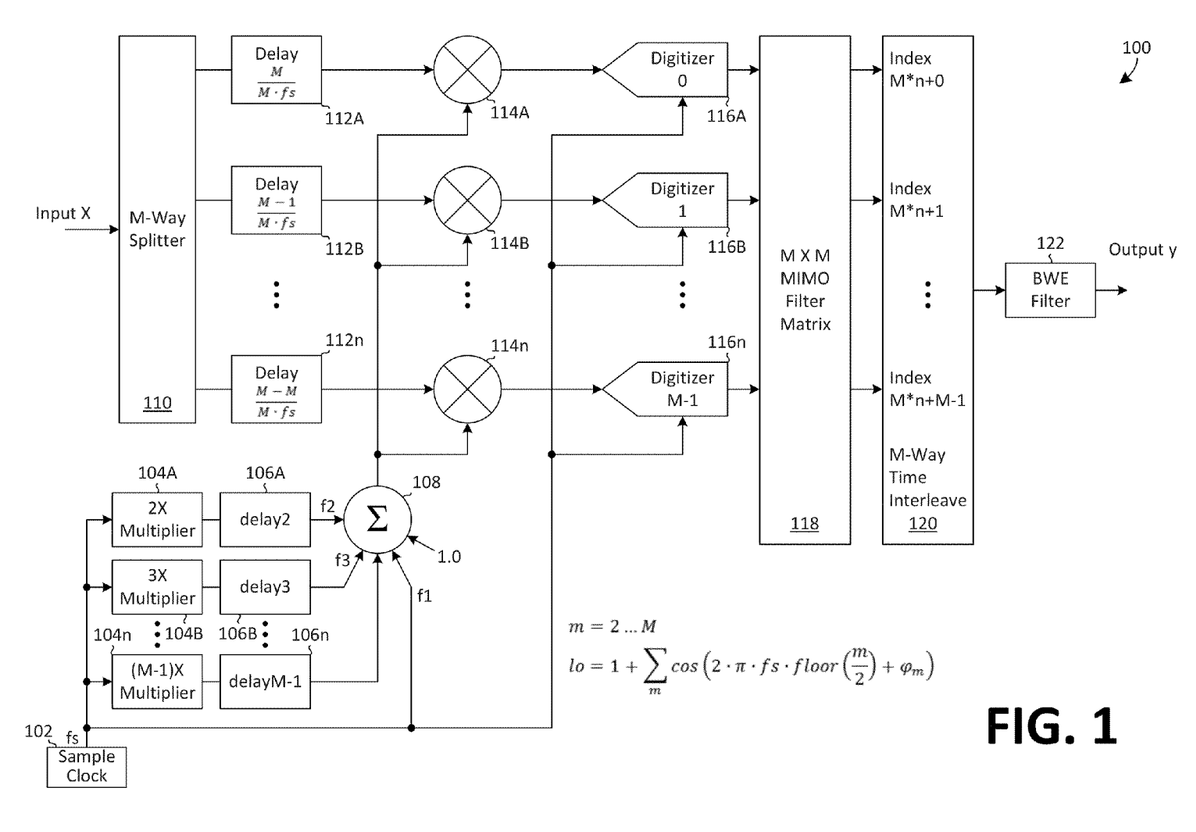
FIG. 1 is a block diagram illustrating an example of a harmonic time interleave (HTI) architecture in accordance with certain embodiments of the disclosed technology.

FIG. 1 is a block diagram illustrating an example of a harmonic time interleave (HTI) architecture 100 in accordance with certain embodiments of the disclosed technology. The architecture may operate in an equivalent manner to standard scope time domain interleave (TDI) digitizer systems. A standard scope digitizer has a mixer at the input to the A/D converter. This mixer is often referred to as a sample and hold circuit. The impulse train on a reference input is multiplied by the input signal and the result is stored in an analog circuit while the A/D converter generates a binary number to store in memory. Multiple digitizers are currently time interleaved by delaying the sample clocks of the digitizer in each pipe. Thus signal reconstruction is performed by interleaving the output data samples from each digitizer pipe.

In the example 100, an input X is passed through an M-way splitter 110, with the outputs therefrom passing through corresponding delays 112A-n to mixers 114A-n that are positioned in front of digitizers 116A-n in a manner and configuration that allows both the bandwidth and sample rate to be increased beyond what the individual digitizers 116A-n can do, while concurrently preforming the reconstruction with time interleave only and no additional digital signal processing (DSP).

The frequency domain spectrum of the sample clock 102 reference signal is also a series of impulses in the frequency domain where the frequency spacing of the harmonics is directly related to the period between the impulses of the sample clock 102. The relationship is shown in the following equation.

$$\Delta f = 1/T \quad (1)$$

where delta f refers to the frequency spacing between the harmonics in the sample clock impulse train, and T refers to the time between impulses in the time domain. For a standard digitizer, the sample rate fs determines the value of T as shown in (2):

$$T = 1/fs \quad (2)$$

$$\Delta f = fs \quad (3)$$

Thus the sample and hold mixer also passes the low band from DC up 0.5 fs. Therefore, the total content of the mixer reference oscillator input would be defined as:

$$m = 2 \ldots M$$

$$lo = 1 + \sum_m \cos\left(2 \cdot \pi \cdot fs \cdot \text{floor}\left(\frac{m}{2}\right) + \phi_m\right) \quad (4)$$

Consequently, only one harmonic is needed for 2-way or 3-way interleave, only two harmonics are needed for 4-way and 5-way interleave, etc.

The value of φ represents the optimized delay, which may be adjusted during the design phase. This can be done so that the sum of harmonics does not generate large pulses, e.g., to maximize SNR.

In embodiments according to the disclosed technology, all mixers in the system have the same local oscillator signal (lo) in (4) applied to the reference oscillator input. This is different than in ATI and DBI systems, and advantageously allows reconstruction using only time domain interleave after digitizing the signals.

In the example 100, the sample clock 102 (fs) for the digitizers 116n can be used as the base signal, and the remaining cosine terms may be applied from frequency multiplier circuits 104A-n with corresponding delays 106A-n and then summed together 108. This keeps all mixer and digitizer clock and reference signals synchronized together. Notice there is a 1.0 term in the reference signal which, multiplied times the input signal, equals the input signal to the mixer. Thus, this system 100 includes a mixer capable of passing the input signal without frequency translating it.

If the cosine terms in the oscillator signal are aligned with a zero phase reference position, the effect is that the signal looks like a series of pulses offset by 1.0.

Figure 2:
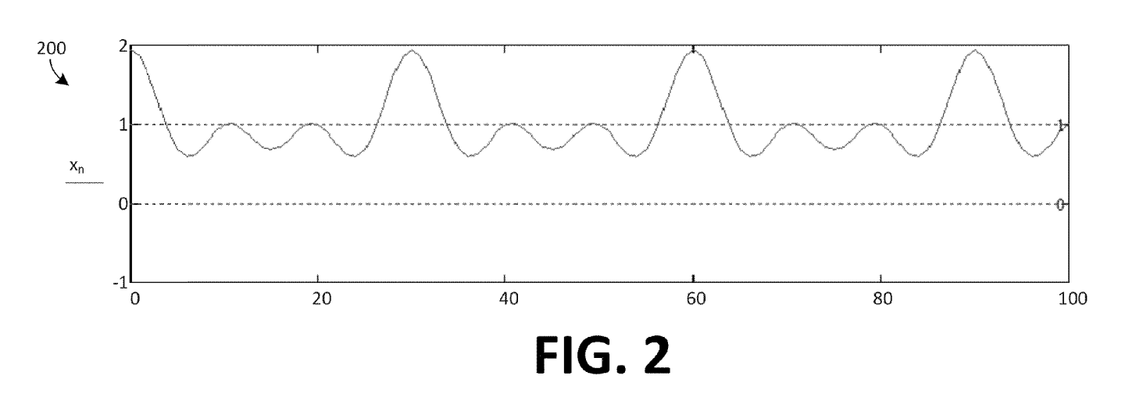
FIG. 2 illustrates a first example of a graphical representation of the LO signal input to the mixer of the HTI architecture of FIG. 1 with harmonic peaks aligned at a time reference position.

FIG. 2 illustrates a first example 200 of a graphical representation of the LO signal input to the mixer of the HTI architecture of FIG. 1 with harmonic peaks aligned at a time reference position.

Figure 3:
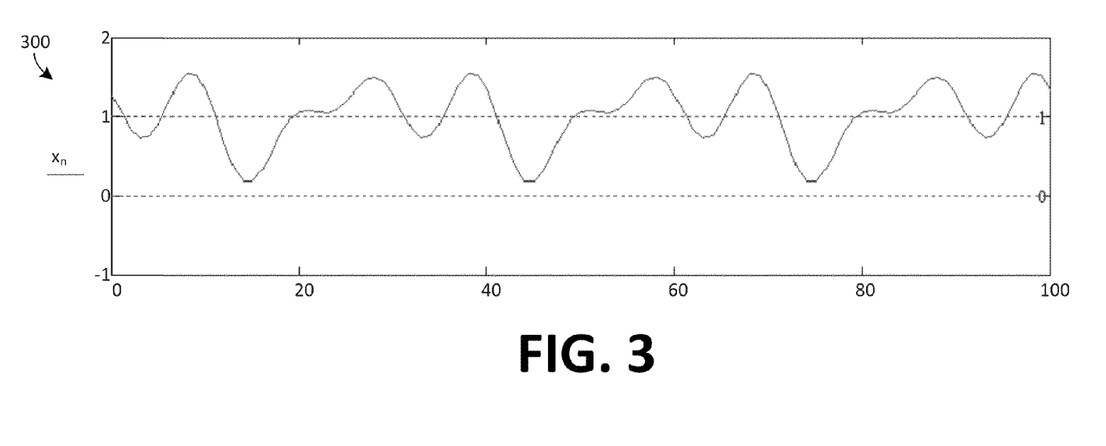
FIG. 3 illustrates a second example of a graphical representation of the LO signal input to the mixer with harmonics at a different time alignment with respect to the same at a time reference position as in FIG. 2.

Another advantage of the disclosed technology over standard sample/hold mixers in the digitizer is that the harmonics may be optimized in phase so that the LO signal looks more like that shown in FIG. 3, which illustrates a second example 300 of a graphical representation of the LO signal input to the mixer with harmonics at a different time alignment with respect to the same at a time reference position as in FIG. 2. FIG. 3 shows that different phases can minimize the pulses, e.g., to optimize SNR. This advantageously maximizes the amplitude of each reference harmonic into the mixer while at the same time minimizing any peaks or valleys in the summation, which simply cannot be done by standard sample/hold mixer circuits.

In certain embodiments, a poly-phase filter matrix array may be used to correct the final pipes' phases in the reconstructed output signal.

In certain embodiments, the delays in the harmonic delay blocks may be optimized to obtain a maximum summation of harmonics, with minimum peaks and maximum valleys. This will generally result in the maximum SNR for the system. These delays may be obtained from Mathcad or Matlab optimization routines, for example, and then designed as fixed delays into the hardware.

In alternative embodiments, the system may have programmable delay circuits that could be tuned and optimized at calibration time for the delays in the harmonic blocks.

The highest harmonic in a 4-way system with a 50 GHz sample clock would require a 150 GHz harmonic. At such frequencies it may be difficult to exactly predict and set the delays to the required values. Therefore, it may be necessary to make a runtime optimizer and programmable circuit configured to adapt to optimized delay settings. This may also be useful if the system design could change as the system reconfigures for different modes of operation, or if the delays could change for other reasons such as temperature or aging or humidity or other.

In the example 100, the input signal X is split M ways by a power splitter 110. This basically passes the full bandwidth input signal to each mixer and digitizer pair (i.e., 114A-n/116A-n) in the system 100. An M-way system thus has M mixers and digitizer pairs.

The RF delay blocks 112A-n in series with the RF input to each of the corresponding mixers 114A-n are not used in existing ATI and DBI schemes. This feature advantageously enables the digitized signal to be reconstructed using only time domain interleave. In contrast, ATI and DBI systems both require software mixers in order to perform signal reconstruction. For example, ATI systems rely on different delays on the cosine terms in the various mixers, which results in the overlaid bands that are frequency shifted to have different delays. However, the low band that is not shifted has the same delay in every mixer, which is the primary reason that ATI systems cannot reconstruct the signal using time domain interleave only.

HTI systems in accordance with the disclosed technology place different delays on the input RF to each mixer. Thus, all bands out of the mixer have different time delays from one mixer to the next, which is identical behavior to that of a standard scope time interleaved digitizer system. Therefore, HTI implementations can advantageously reconstruct the digitized signal using only time domain interleave with no software mixers. The delays required for HTI are defined as follows:

Letting the different channels be labeled with index from $$m = 0 \ldots M-1 \quad (5)$$

the required delays are $$\text{delay}_m = M - m + 1/M \cdot fs \quad (6)$$

The reconstructed signal would then be the time domain interleave as represented by the following equation:

$$y_n = \sum_m x^{\langle m \rangle}_{M \cdot n + m} \quad (7)$$

where $x^{\langle 0 \rangle}$ represents the output data from digitizer 0, $x^{\langle 1 \rangle}$ represents the output data from digitizer 1, and so on. Thus, equation (7) represents the final signal reconstruction time domain interleave operation. The demultiplexer hardware in existing oscilloscopes can perform this interleave automatically as the data is saved to acquisition memory. Thus, no additional DSP is required for an HTI system to reconstruct the signal. However, to correct for phase and magnitude errors in the reconstructed signal, a poly-phase filter matrix block 118 may be used along with an interleave reconstruction block 120 to interleave the time domain signal samples from each digitizer to create the reconstructed waveform with a higher sample rate. A bandwidth enhance (BWE) filter 122 may also be applied, e.g., to correct the phase and magnitude over the entire bandwidth.

The filter matrix block 118 and interleave reconstruction block 120 may perform an M×M poly-phase interleave calibration, e.g., to measure the difference between all interleaved digitizer paths and perform a matrix filter operation on the paths to make them all match each other and maintain the proper interleave phase difference between paths. In such embodiments, the total value of M is not just from the mixer/digitizer pairs but also from the number of pipes in each digitizer. Thus, the total number of interleaved pipes would be:

$$TotalWayInterleave = M*Q \qquad (8)$$

where Q represents the number of interleave pipes in each digitizer and is the same for each digitizer, and where M represents the number of mixer/digitizer pairs in the system, e.g., to correct the phase errors due to the optimized delays that were used for the mixer harmonic reference inputs.

Figure 4:
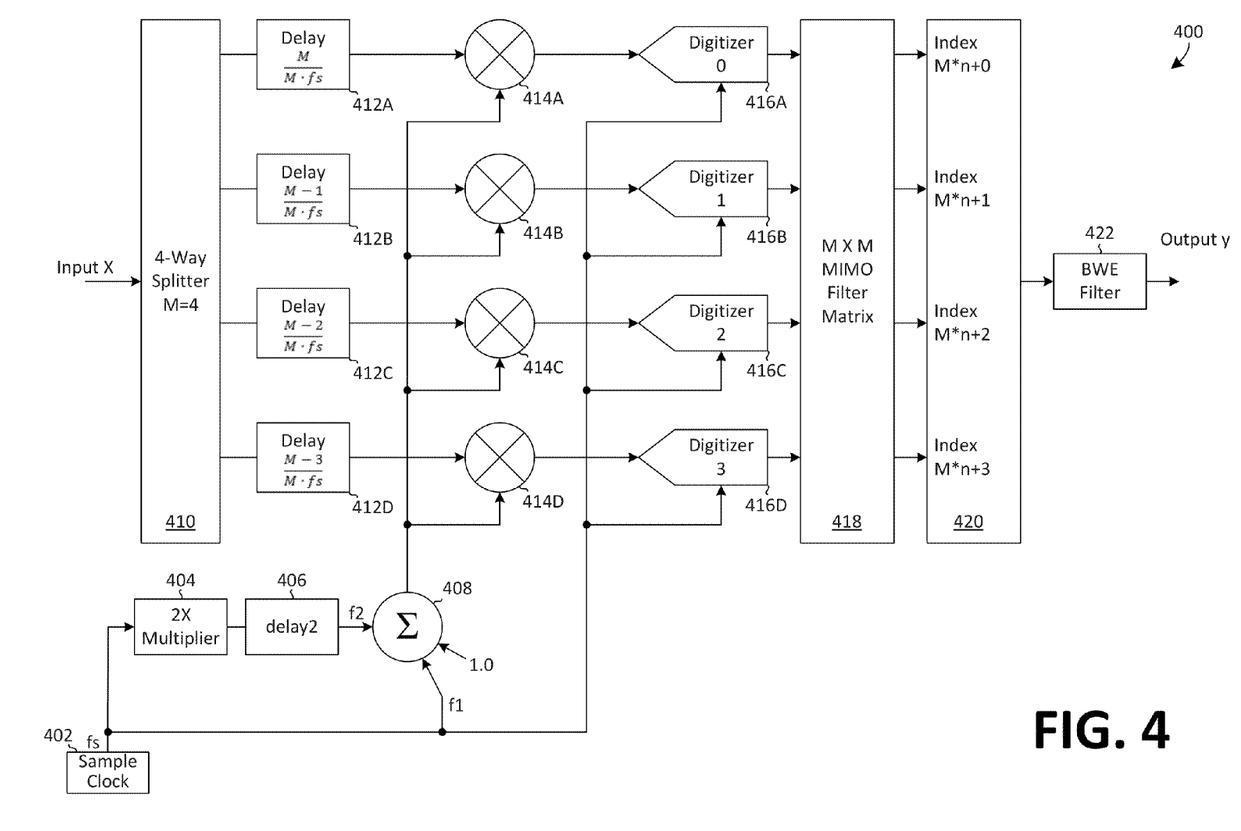
FIG. 4 is a block diagram illustrating an example of a 4-way HTI architecture in accordance with certain embodiments of the disclosed technology.

FIG. 4 is a block diagram illustrating an example of a 4-way HTI architecture 400 in accordance with certain embodiments of the disclosed technology. The 4-way HTI architecture 400 is similar to the general HTI architecture 100 of FIG. 1 in that the 4-way architecture 400 has a splitter 410, RF delay blocks 412A-D leading into corresponding mixers 414A-D, the outputs of which are fed into digitizers 416A-D, which also receive a sample clock 402. Also, the sample clock 402 inputs to a frequency multiplier 404 and a delay block 406 that feeds into a summing component 408 that passes the output therefrom to the mixers 414A-D. In the example, the 4-way HTI architecture 400 also includes a poly-phase filter matrix block 418 and an interleave reconstruction block 420. A BWE filter 422 may also be applied.

Figure 5:
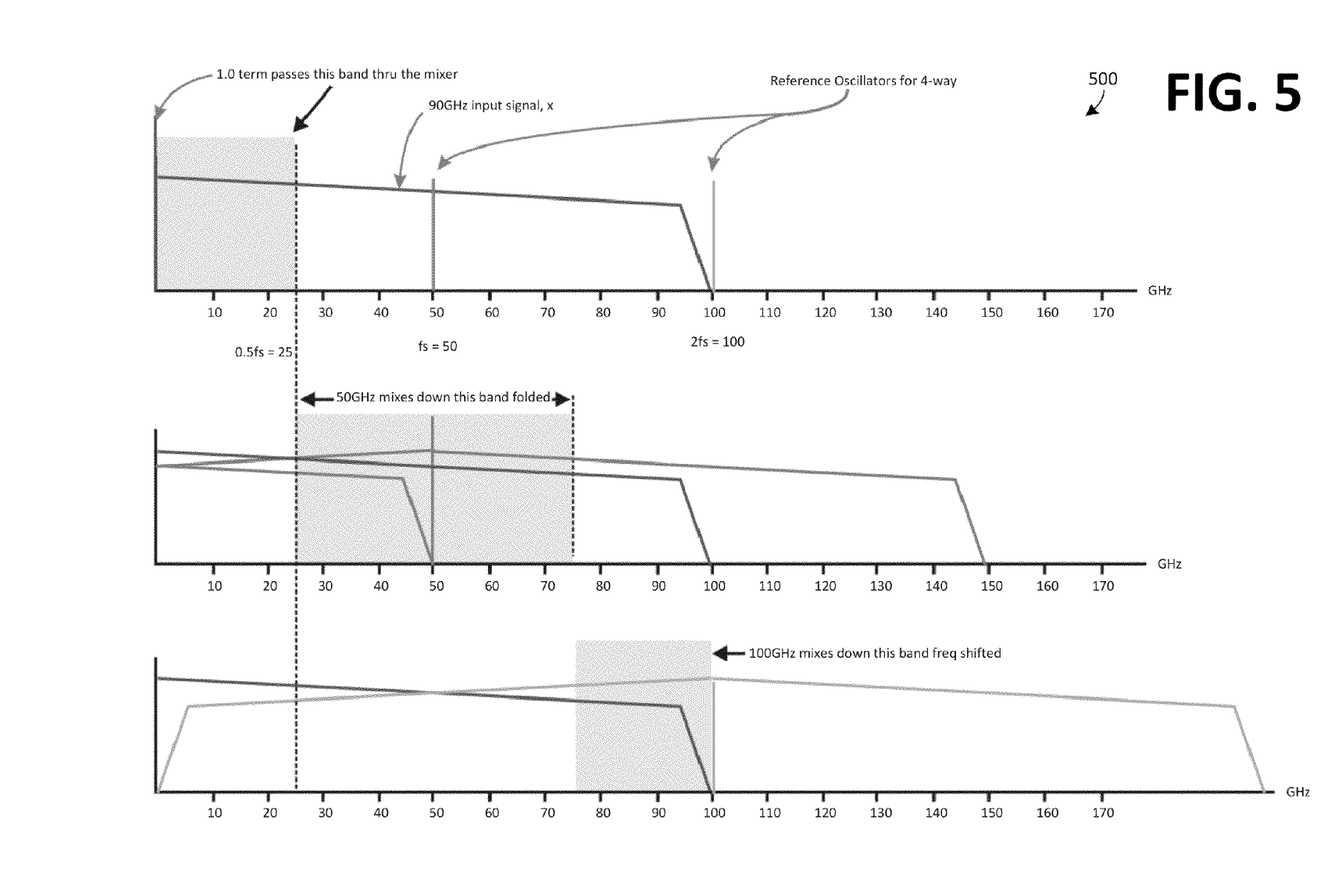
FIG. 5 illustrates an example of a graphical representation of mixing spectrums for a digitizer fs of 50 GHz in the 4-way HTI architecture of FIG. 4.

FIG. 5 illustrates an example 500 of a graphical representation of mixing spectrums for a digitizer fs of 50 GHz in the 4-way HTI architecture 400 of FIG. 4.

Figure 6:
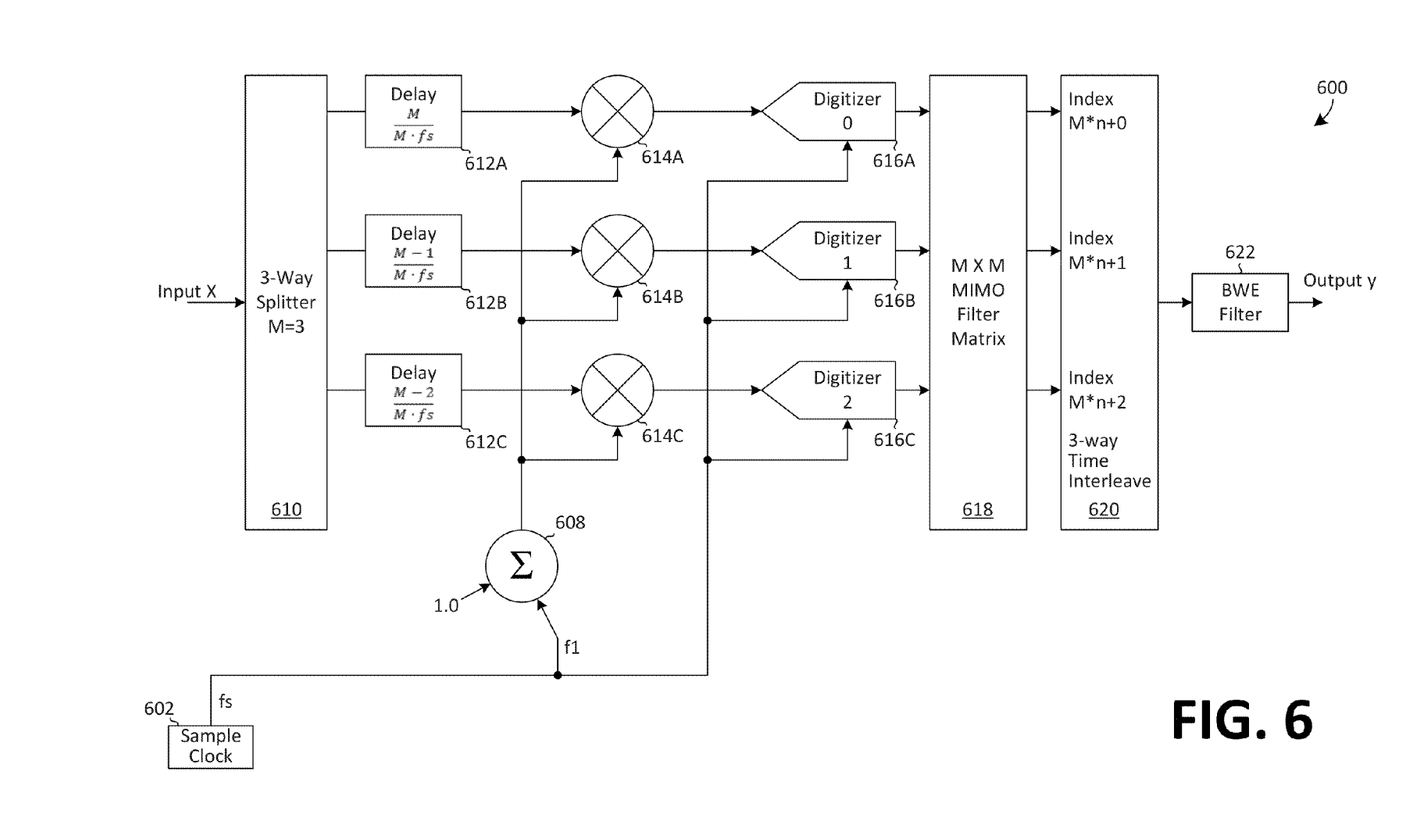
FIG. 6 is a block diagram illustrating an example of a 3-way HTI architecture in accordance with certain embodiments of the disclosed technology.

FIG. 6 is a block diagram illustrating an example of a 3-way HTI architecture 600 in accordance with certain embodiments of the disclosed technology. The 3-way HTI architecture 600 is similar to the general HTI architecture 100 of FIG. 1 in that the 3-way architecture 600 has a splitter 610, RF delay blocks 612A-C leading into corresponding mixers 614A-C, the outputs of which are fed into digitizers 616A-C, which also receive a sample clock 602. Also, the sample clock 602 inputs into a summing component 608 that passes the output therefrom to the mixers 614A-C. In the example, the 3-way HTI architecture 300 also includes a poly-phase filter matrix block 618 and an interleave reconstruction block 620. A BWE filter 622 may also be applied.

Figure 7:
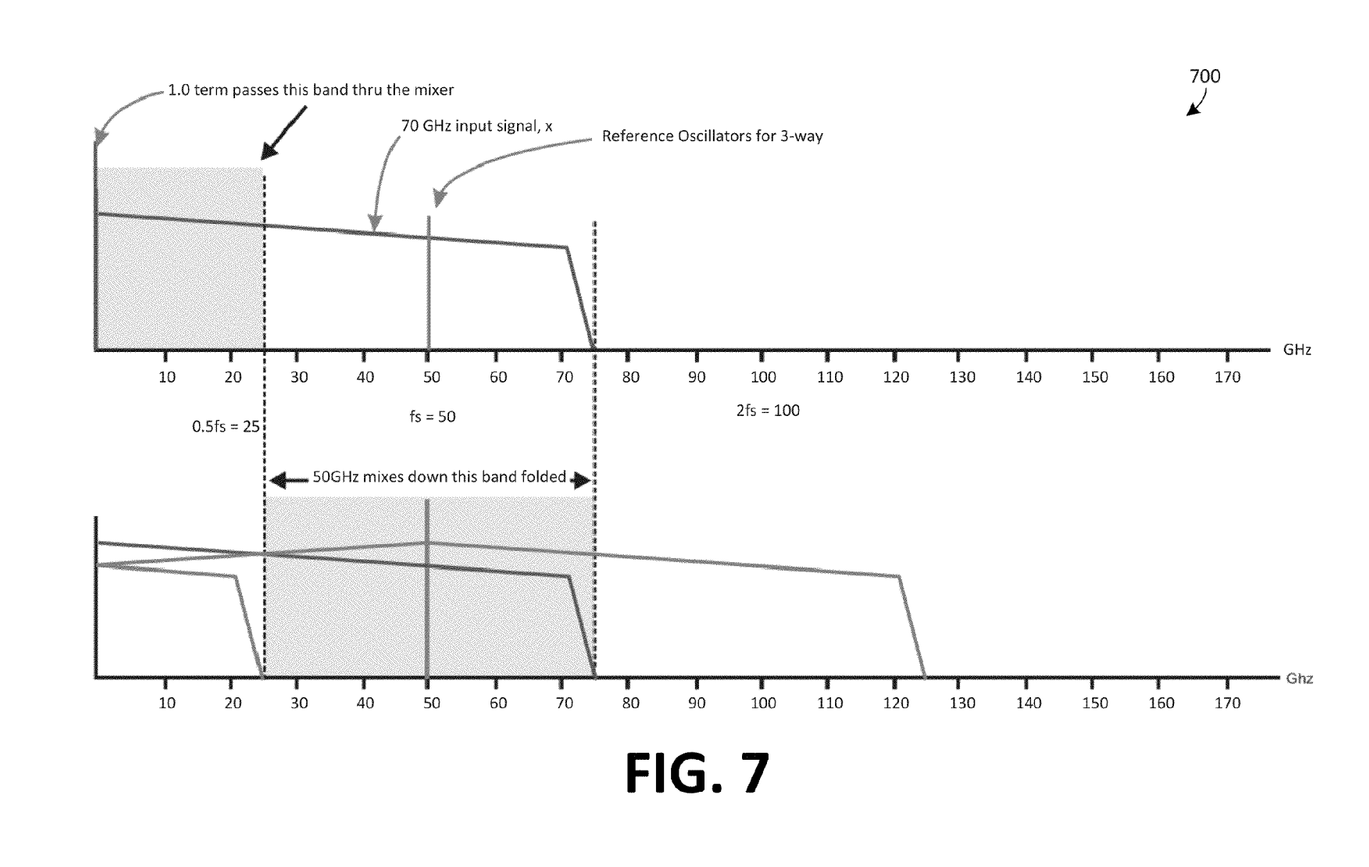
FIG. 7 illustrates an example of a graphical representation of mixing spectrums for a digitizer fs of 50 GHz in the 3-way HTI architecture of FIG. 6.

FIG. 7 illustrates an example 700 of a graphical representation of mixing spectrums for a digitizer fs of 50 GHz in the 3-way HTI architecture 600 of FIG. 6.

Figure 8:
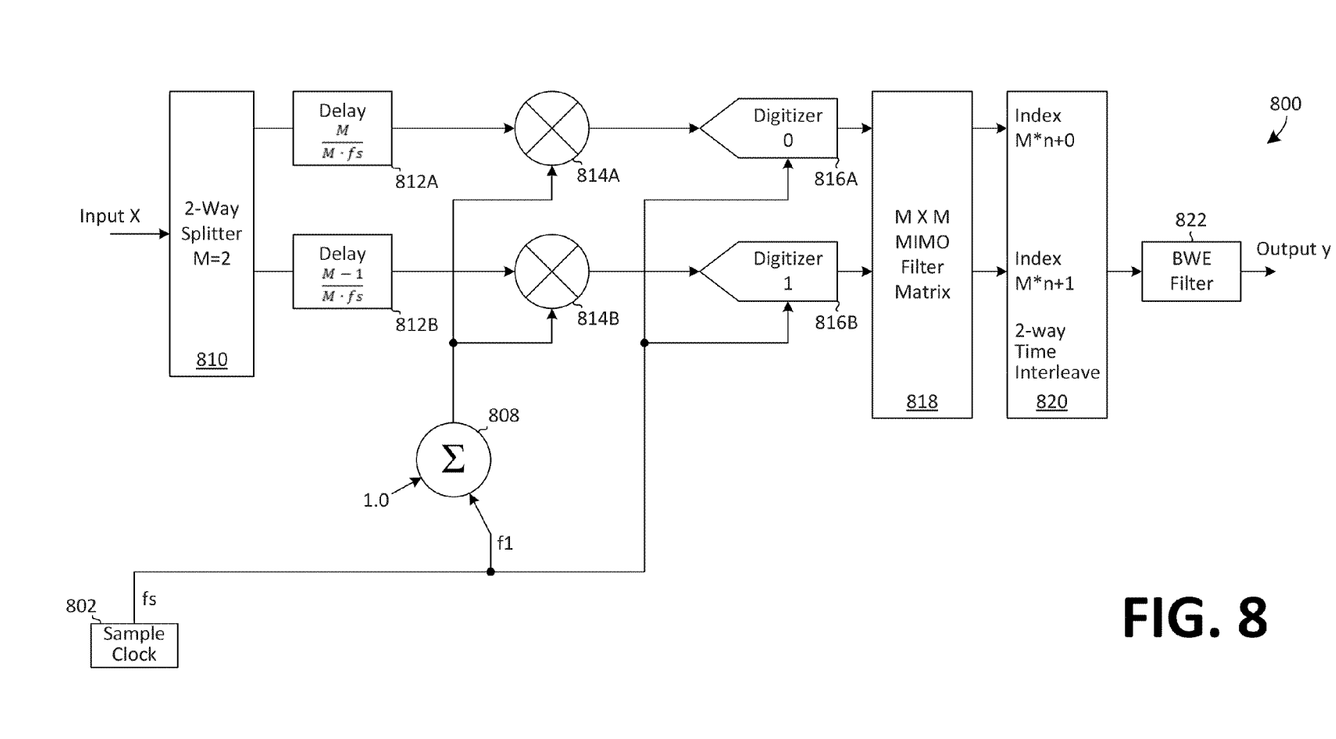
FIG. 8 is a block diagram illustrating an example of a 2-way HTI architecture in accordance with certain embodiments of the disclosed technology.

FIG. 8 is a block diagram illustrating an example of a 2-way HTI architecture 800 in accordance with certain embodiments of the disclosed technology. The 2-way HTI architecture 800 is similar to the general HTI architecture 100 of FIG. 1 in that the 2-way architecture 800 has a splitter 810, RF delay blocks 812A-B leading into corresponding mixers 814A-B, the outputs of which are fed into digitizers 816A-B, which also receive a sample clock 802. Also, the sample clock 802 inputs into a summing component 808 that passes the output therefrom to the mixers 814A-B. In the example, the 2-way HTI architecture 800 also includes a poly-phase filter matrix block 818 and an interleave reconstruction block 820. A BWE filter 822 may also be applied.

Figure 9:
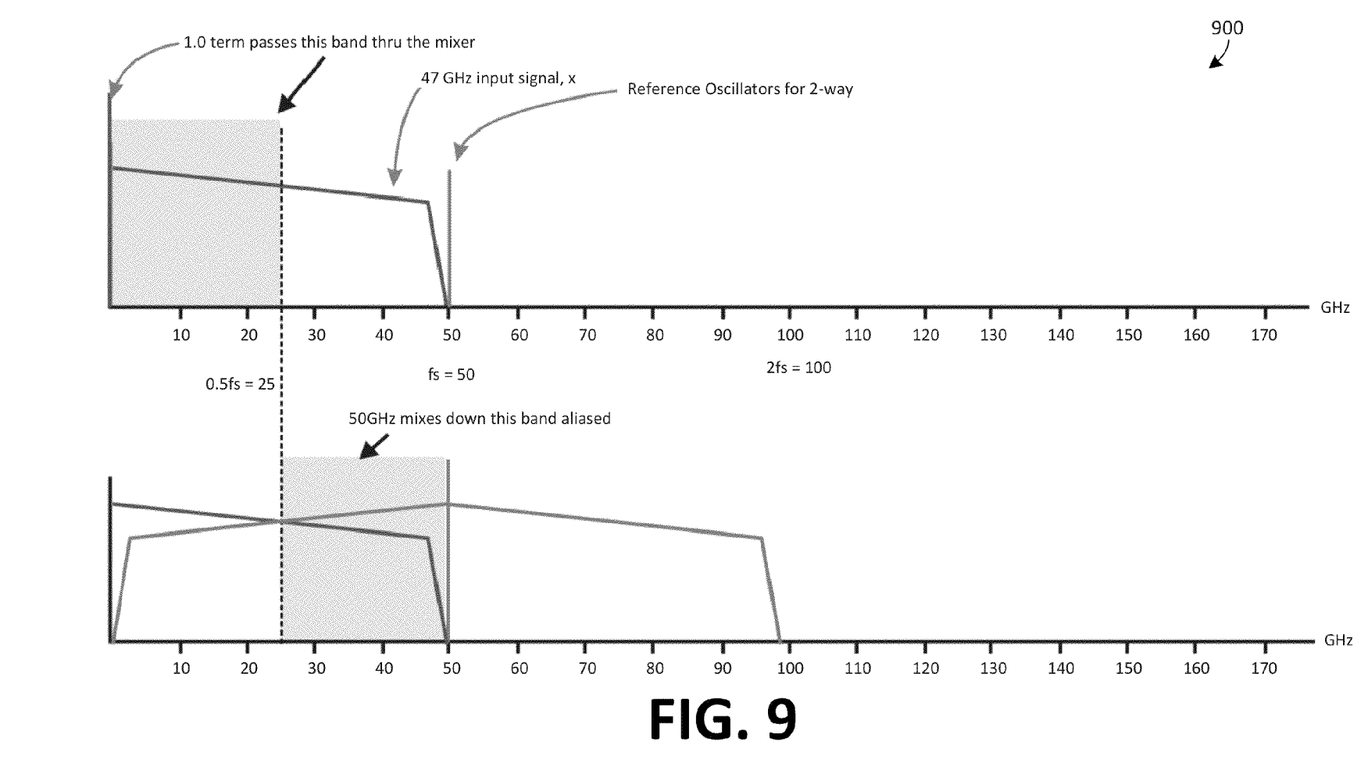
FIG. 9 illustrates an example of a graphical representation of mixing spectrums for a digitizer fs of 50 GHz in the 2-way HTI architecture of FIG. 8.

FIG. 9 illustrates an example 900 of a graphical representation of mixing spectrums for a digitizer fs of 50 GHz in the 2-way HTI architecture 800 of FIG. 8.

Embodiments according to the disclosed technology generally require no software mixers for signal reconstruction, which makes such systems faster and simpler than ATI and DBI systems, e.g., for faster acquisition updates. In other words, embodiments according to the disclosed technology require no frequency translation blocks for signal reconstruction; rather, such embodiments only require time domain interleave of the output of M digitizers to reconstruct the signal. This makes for more efficient use of scope digitizer bandwidth and sample rate. For example, whereas a certain ATI system may get 70 GHz on one channel, a comparable HTI system could obtain around 90 to 95 GHz on one channel.

In embodiments according to the disclosed technology, all mixers in each pipe have the same LO reference signal applied, e.g., it contains numerous harmonics. In contrast, ATI systems use different oscillator harmonics on each mixer which results in shifting in time the aliased high bands but not the low bands. Applying the same reference signal on all mixers is part of solution to eliminate software mixers from the reconstruction phase.

In embodiments according to the disclosed technology, delay blocks are added to the RF input signal to each mixer, which results in all bands at the output of the mixer to be time delayed in a manner that is consistent with how standard time interleaved sample/hold mixers output. This also aids in allowing reconstruction to be performed using a simple time domain interleave of the output of all of the digitizers. The delay of each pipe is a fraction of the base sample rate of the digitizer in the pipe.

In embodiments according to the disclosed technology, the harmonics in the mixer reference signal start with the first one equal to the sample rate of the digitizers in the pipe. The second one is twice the sample rate, the third is three times the sample rate, and so on. Since only one harmonic is needed for 2-way and 3-way systems and only two harmonics are needed for 4-way systems, this makes the LO mixer reference simpler than a track/hold mixer impulse reference, and less harmonic content results in better SNR. Also, the delay blocks are used to ensure that the summation of reference harmonics to the mixer results in maximum levels for each harmonic while minimizing peaks or valleys in the final summation.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

I claim:

1. A harmonic time interleave (HTI) system, comprising:
   a sample clock configured to provide a reference signal;
   a summing component configured to receive the reference signal at a first input and a second input to receive a delayed harmonic signal derived from the reference signal, the summing component producing a summed reference signal;
   a splitter component configured to receive an input signal and having a plurality of outputs for developing at each of the plurality of outputs a respective output signal exhibiting substantially the same bandwidth as the input signal;
   a first plurality of delay blocks each configured to receive a respective output signal from the splitter;
   a plurality of mixing components each configured to receive the summed reference signal from the summing component and an output signal from a corresponding one of the first plurality of delay blocks;
   a plurality of digitizing components each configured to receive the reference signal from the sample clock and an output from a corresponding one of the plurality of mixing components; and
   a controller implementing a poly-phase filter matrix block configured to receive an output from each of the plurality of digitizing components, and implementing
   an interleave reconstruction block configured to receive an output from the poly-phase filter matrix block and interleave time domain signal samples from each digitizer to create a substantially full-bandwidth digital representation of the input signal.

2. The HTI system of claim 1, wherein the created representation of the input signal has a higher sample rate than an initial sampled waveform output from the digitizers.

3. The HTI system of claim 1, further comprising:
   a bandwidth enhance (BWE) filter configured to correct phase and magnitude of the reconstructed waveform.

4. The HTI system of claim 1, further comprising:
   a plurality of frequency multipliers each configured to receive the reference signal from the sample clock to produce the harmonic signal.

5. The HTI system of claim 4, further comprising:
   a second plurality of delay blocks each configured to receive an output from a corresponding one of the plurality of frequency multipliers to produce the delayed harmonic signal.

6. The HTI system of claim 5, wherein the summing component is further configured to receive an output from each of the second plurality of delay blocks.

7. The HTI system of claim 1, wherein the first plurality of delay blocks includes four delay blocks, the plurality of mixing components includes four mixing components, and the plurality of digitizing components includes four digitizing components.

8. The HTI system of claim 7, further comprising:
   a frequency multiplier configured to receive the reference signal from the sample clock; and
   a secondary delay block configured to receive an output from the frequency multiplier.

9. The HTI system of claim 8, wherein the summing component is further configured to receive an output from the secondary delay block.

10. The HTI system of claim 1, wherein the first plurality of delay blocks includes three delay blocks, the plurality of mixing components includes three mixing components, and the plurality of digitizing components includes three digitizing components.

11. The HTI system of claim 1, wherein the first plurality of delay blocks includes two delay blocks, the plurality of mixing components includes two mixing components, and the plurality of digitizing components includes two digitizing components.

12. The HTI system of claim 1, wherein the second input to the summing component is a dc value corresponding to a factor of substantially 1.0.

13. The HTI system of claim 1, wherein the input signal is a radio frequency (RF) signal.

14. The HTI system of claim 13, wherein the first plurality of delay blocks are RF delay blocks.

15. The HTI system of claim 1, wherein the input signal is a broadband signal from DC up to a maximum frequency of M times the bandwidth of each of the plurality of digitizing components, wherein M represents the number of digitizing components.

16. The HTI system of claim 7, wherein the input signal is a broadband signal from DC up to a maximum frequency of 4 times the bandwidth of each of the plurality of digitizing components.

17. The HTI system of claim 10, wherein the input signal is a broadband signal from DC up to a maximum frequency of 3 times the bandwidth of each of the plurality of digitizing components.

18. The HTI system of claim 11, wherein the input signal is a broadband signal from DC up to a maximum frequency of 2 times the bandwidth of each of the plurality of digitizing components.

* * * * *